United States Patent
Wong et al.

[11] Patent Number: 6,069,082
[45] Date of Patent: May 30, 2000

[54] METHOD TO PREVENT DISHING IN DAMASCENE CMP PROCESS

[75] Inventors: Harianto Wong; John Leonard Sudijono, both of Singapore, Singapore

[73] Assignee: Chartered Semiconductor Manufacturing Ltd., Singapore, Singapore

[21] Appl. No.: 09/170,734

[22] Filed: Oct. 13, 1998

[51] Int. Cl.[7] .................................................. H01L 21/302
[52] U.S. Cl. ......................... 438/692; 438/694; 438/695; 438/700; 438/756; 438/757
[58] Field of Search .................................... 438/638, 692, 438/691, 694, 695, 697, 700, 703, 745, 754, 756, 757, 755; 257/752, 763

[56] References Cited

U.S. PATENT DOCUMENTS

| | | | |
|---|---|---|---|
| 5,385,867 | 1/1995 | Ueda et al. | 437/195 |
| 5,426,330 | 6/1995 | Joshi et al. | 257/752 |
| 5,441,094 | 8/1995 | Pasch | 156/636.1 |
| 5,602,423 | 2/1997 | Jain | 257/752 |
| 5,635,423 | 6/1997 | Huang et al. | 438/638 |
| 5,677,244 | 10/1997 | Venkatraman | 437/198 |
| 5,731,245 | 3/1998 | Joshi et al. | 438/705 |

OTHER PUBLICATIONS

C.Y. Chang et al, "ULSI Technology", The McGraw–Hill Companies, New York, 1996, p. 444–445.

*Primary Examiner*—Benjamin L. Utech
*Assistant Examiner*—Binh X. Tran
*Attorney, Agent, or Firm*—George O. Saile; Rosemary L.S. Pike; William J. Stoffel

[57] ABSTRACT

A method of fabrication of a metal lines without dishing using damascene and chemical-mechanical polish processes. A Key feature is the hard cap layer that is only formed over the trench opening. The hard cap layer prevents dishing of the metal line and also allows faster CMP than blanket polish stop layers. The method includes forming a first dielectric layer having a first trench opening over a semiconductor structure. A metal layer is deposited in the first trench opening. The metal layer has a dimple. The metal layer is preferably composed of Al or Cu. A hard mask is formed having a first opening over the first trench opening. The first opening is at least partially over first trench opening. A hard cap layer (e.g., W or $WSi_x$) is selectively deposited on the metal layer exposed in the first opening. The hard cap layer, the hard mask, and the metal layer are chemical-mechanical polished to completely remove the hard mask resulting in a metal line having a "dishing free" flat top surface. The chemical-mechanical polish rate of the hard cap is less than the rate of the metal layer.

12 Claims, 1 Drawing Sheet

METHOD TO PREVENT DISHING IN DAMASCENE CMP PROCESS

BACKGROUND OF INVENTION

1) Field of the Invention

This invention relates generally to fabrication of metal lines in semiconductor devices and more particularly to the fabrication of metal lines using a damascene chemical-mechanical polish process that prevents dishing.

2) Description of the Prior Art

Low resistivity metal such as aluminum and cooper and their binary and ternary alloys have been widely explored as fine line interconnects in semiconductor manufacturing. Typical examples of fine line interconnect metal include $Al_xCu_y$, ternary alloys Al—Pd—Cu, and Al—Pd—Ni and Al—Cu—Si and other similarly low resistivity metal based alloys. Emphasis on scaling down line width dimensions in very large scale integrated (VLSI) circuitry manufacture has led to reliability problems including inadequate isolating, electromigration, and planarization.

Damascene processes using metal filling vias and lines followed by chemical-mechanical polish (CMP) with various Al, Cu, and Cu-based alloys are a key element of wiring technologies for very large-scale system integration. Damascene and dual damascene processes are described C. Y. Chang, S. M. Sze, in *ULSI Technology*, by The McGraw-Hill Company, INC. copyright 1997, pp. 444–445.

As the inventor's damascene and dual damascene processes have been implemented with soft metals (e.g., metals such as Al—Cu, Cu, alloys of Al etc.) the inventor has found that the CMP process has caused a dishing problem in the top surface of the metal lines. That is the CMP process removed more material in the center of the metal lines that at the edges thus causing an indentation or dishing problem. Preventing this dishing is the main object of this invention.

The importance of overcoming the various deficiencies noted above is evidenced by the extensive technological development directed to the subject, as documented by the relevant patent and technical literature. The closest and apparently more relevant technical developments in the patent literature can be gleaned by considering: U.S. Pat. No. 5,731,245 (Joshi et al) shows a damascene CMP method using a hard cap layer 30 over a metal layer (Al or Cu). U.S. Pat. No. 5,441,094 (Pasch) shows a CMP process for planarizing trenches. U.S. Pat. No. 5,385,867 (Udea et al.) shows a various Cu or Al wire structures that can be planarized by CMP. U.S. Pat. No. 5,677,244 (Venkatraman) shows a damascene structure using Al or/and Cu that is planarized by CMP.

SUMMARY OF THE INVENTION

It is an object of the present invention to provide a method for fabricating a metal line or interconnect using a damascene process that preventing dishing of the metal line.

It is an object of the present invention to provide a method for fabricating a metal line or interconnect (Al or Cu alloys) using a CMP damascene process that preventing dishing of the metal line.

To accomplish the above objectives, the present invention provides a method of fabrication of a metal lines using damascene and chemical-mechanical polish process in a semiconductor device. A Key feature is the hard cap layer 40 is only formed over the trench opening 14. The hard cap layer prevents dishing of the metal line and also allows faster CMP than blank polish stop layers.

The method includes forming a first dielectric layer 12 having a first trench opening 14 over a semiconductor structure 10. A metal layer 20 is deposited in the first trench opening. The metal layer preferably has a dimple 22. The metal layer is preferably composed of Al-alloys or Cu. A hard mask 30 is formed having a first opening 32 over the first trench opening 14. The hard mask is preferably composed of oxide and SiN. The first opening 32 is at least partially over first trench opening 14. A hard cap layer 40 (e.g., W or $WSi_x$) is selectively deposited on the metal layer exposed in the first opening 32 at least partially over the trench opening. The hard cap layer 40, the hard mask 30, and the metal layer are chemical-mechanical polished to completely remove the hard mask 30 resulting in a metal line 40 20 having a "dishing free" flat top surface. The chemical-mechanical polish rate of the hard cap 40 is less than the rate of the metal layer 20.

Benefits

The present invention prevents chemical-mechanical polish dishing problem on metal lines. The inventors have found a new problem of dishing of metal lines by chemical-mechanical polish processes. The invention prevents dishing of metal lines by using a hard mask to selectively form a hard cap 40 over the trench opening 14. The combination of the hard mask and hard cap 40 is critical to forming metal lines with flat surfaces.

The inventor has found that the combination of the hard mask and hard cap 40 is far superior to a technique that forms a blanket hard cap layer over the entire wafer surface and the chemical-mechanical polishes the blanket hard cap layer down to the metal layer. The inventor have found that blanket stop layer increase the dishing problem on metal lines.

It is important to note that the inventors discovered the interconnect dishing problem because of their analysis and product process sensitivity. The discovery of the problem lead the inventor to discover an effective solution to prevent dishing while being a highly manufacturable process.

Also, the invention only forms the hard cap 40 over the trench opening 14 and dimple 22. This allows faster chemical-mechanical polishing compared to blank polish stop layers and also reduces the amount of dishing.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known processes have not be described in detail in order to not unnecessarily obscure the present invention.

It should be recognized that many publications describe the details of common techniques used in the fabrication process of integrated circuit components. See, E.g., C. Y. Chang, S. M. Sze, in *ULSI Technology*, by The McGraw-Hill Company, Inc. copyright 1997; pp. 444 & 445. Those techniques can be generally employed in the fabrication of the structure of the present invention. Moreover, the individual steps of such a process can be performed using commercially available integrated circuit fabrication machines. As specifically necessary to than understanding of the present invention, exemplary technical data are set forth based upon current technology. Future developments in the art may call for appropriate adjustments as would be obvious to one skilled in the art.

The present invention provides a method of fabrication of a metal lines (and/or interconnects) using a damascene chemical-mechanical polish process in a semiconductor device.

Figure 1:
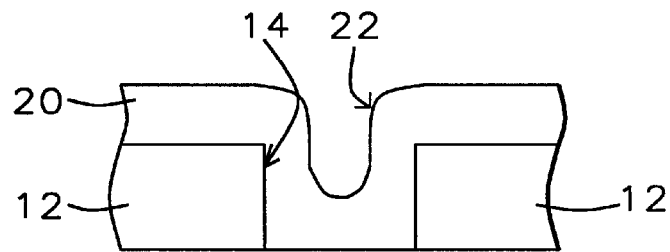
FIGS. 1, 2, 3, and 4 are cross sectional views for illustrating a method for forming a metal line using a damascene process according to the present invention.

FIG. 1 shows the step of forming first dielectric layer 12 having a first trench opening 14 over a semiconductor structure 10. The first dielectric layer can be comprised of several layers.

The first trench opening 14 preferably has a width in a range of between about 0.8 $\mu$m and 10 $\mu$m and a depth in a range of between about 0.4 and 1.0 $\mu$m The inventors have found that dishing starts at a minimum width of the trench opening 14 of about 0.8 $\mu$m. The first trench opening can have any shape, such as dual damascene shaped openings.

The first dielectric layer 12 is preferably composed of silicon oxide ($SiO_2$) or silicon nitride (SiN), and has a thickness in a range of between about 0.2 $\mu$m and 0.8 $\mu$m.

Next, a metal layer 20 is deposited in the first trench opening. The metal layer has a dimple 22. The metal layer 20 is preferably deposited by chemical vapor deposition (CVD) or Physical Vapor Deposition (PVD). The metal layer composed of Al, Al-alloys, Cu or Cu alloys. The inventor has found that metal layers formed of particularly AlCu Ni have the dishing problem. The dimple 22 preferably has a depth in a range of between about 0.2 and 1.0 $\mu$m, and a diameter in a range of between about 0.4 and 9 $\mu$m. Dimples are features of many deposition techniques.

Figure 2:
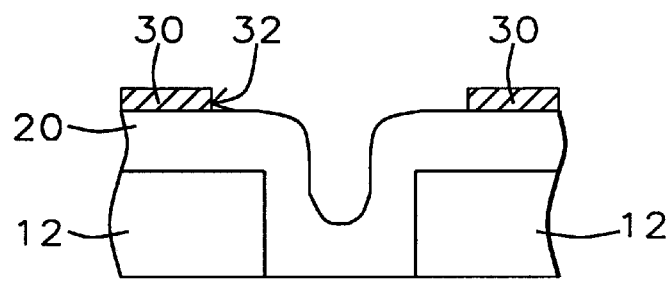

FIG. 2 shows the step of forming a hard mask having a first opening 32 over the first trench opening 14. The hard mask is preferably composed of oxide or silicon nitride (SiN). The hard mask preferably has a thickness in a range of between about 500 and 1500 Å.

Figure 3:
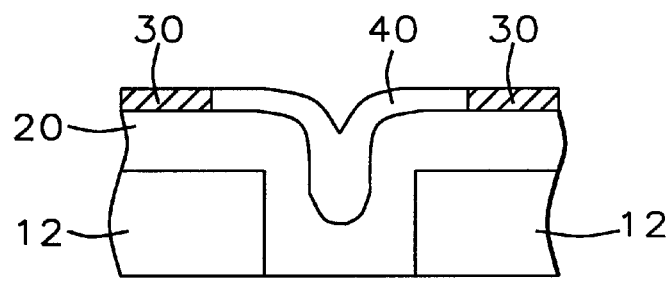

FIG. 3 shows the selectively deposition a hard cap layer 40 on the metal layer exposed in the first opening 32. The hard cap layer 40 is preferably composed of W, WN (Tungsten nitride), or Tungsten silicide ($WSi_x$). The chemical-mechanical polish rate of the hard cap 40 is less than the rate of the metal layer 20.

Figure 4:
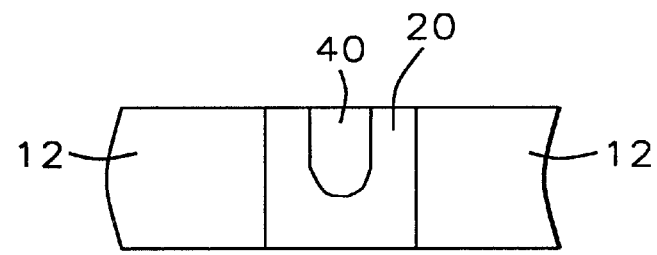

FIG. 4 shows the chemical-mechanical polishing of the hard cap layer 40, the hard mask 30 and the metal layer to completely remove the hard mask 30. This results in a metal line 40 20 having a "dishing free" flat top surface.

The chemical-mechanical polish rate of the hard cap 40 is less than the rate of the metal layer 20. The chemical-mechanical polish ratio between the hard cap layer 40 to the metal layer 20 is between 1:10 and 1:50.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a metal lines using damascene and chemical-mechanical polish processes in a semiconductor device, comprising the steps of:

a) forming first dielectric layer having a first trench opening over a semiconductor structure;

b) depositing a metal layer in said first trench opening; said metal layer having a dimple over said trench opening;

c) forming a hard mask having a first opening over said first trench opening; said hard mask formed on said metal layer said first opening exposing said metal layer;

d) selectively depositing a hard cap layer on said metal layer over said trench opening in said first opening; and e) chemical-mechanical polishing said hard cap layer, said hard mask, and said metal layer to completely remove said hard mask resulting in a metal line having a dish free flat top surface.

2. The method of claim 1 wherein said first trench opening having a width in a range of between about 0.8 and 10 $\mu$m, and a depth in a range of between about 0.4 and 1.0 $\mu$m.

3. The method of claim 1 wherein said dielectric layer is composed of a material selected from the group consisting of silicon oxide and silicon nitride, and has a thickness in a range of between about 0.2 and 1.0 $\mu$m.

4. The method of claim 1 wherein said dimple having a depth in a range of between about 0.2 and 1.0 $\mu$m.

5. The method of claim 1 wherein said hard mask has a thickness in a range of between about 500 and 1500 Å and is composed of a material selected from the group consisting of oxide and silicon nitride.

6. The method of claim 1 wherein said cap layer is composed of a material selected from the group consisting of tungsten, tungsten nitride (WN) and tungsten silicide.

7. The method of claim 1 wherein the chemical-mechanical polish rate of said hard cap is less than the rate of said metal layer; the chemical-mechanical polish rate ratio between said hard cap layer to said metal layer is between 1:10 and 1:50.

8. The method of claim 1 wherein said metal layer is deposited by a process selected from the group consisting of chemical vapor deposition (CVD) and Physical Vapor Deposition (PVD), said metal layer composed of a material selected from the group consisting of Al, Al alloys, Cu, and Cu-alloys.

9. A method of fabrication of a metal lines using damascene and chemical-mechanical polish processes in a semiconductor device, comprising the steps of:

a) forming first dielectric layer having a first trench opening over a semiconductor structure; said first trench opening having a width in a range of between about 0.8 and 10 $\mu$m, b) depositing a metal layer in said first trench opening; said metal layer having a dimple; said metal layer comprised of Al and Cu; said dimple having a depth in a range of between about 0.2 and 1.0 $\mu$m;

c) forming a hard mask having a first opening over said first trench opening; said hard mask formed on said metal layer;

d) selectively depositing a hard cap layer on said metal layer in said first opening; said hard cap layer composed of a material selected from the group consisting of W, tungsten nitride (WN) and tungsten silicide;

e) chemical-mechanical polishing said hard cap layer, said hard mask and said metal layer to completely remove said hard mask resulting in a metal line having a dishing free flat top surface; the chemical-mechanical polish rate of said hard cap is less than the rate of said metal layer; the chemical-mechanical polish rate ratio between said hard cap layer to said metal layer is between 1:10 and 1:50.

10. A method of fabrication of a metal lines using damascene and chemical-mechanical polish processes in a semiconductor device, comprising the steps of:

a) forming first dielectric layer having a first trench opening over a semiconductor structure; said first trench opening having a width in a range of between about 0.8 and 10 μm, and a depth in a range of between about 0.4 and 1.0 μm;

b) depositing a metal layer in said first trench opening; said metal layer having a dimple, said metal layer deposited by a process selected from the group consisting of chemical vapor deposition (CVD) and Physical Vapor Deposition (PVD); said metal layer comprised of Al and Cu; said dimple having a depth in a range of between about 0.2 and 1.0 μm;

c) forming a hard mask having a first opening at over said first trench opening; said hard mask formed on said metal layer; said hard mask composed of a material selected from the group consisting of oxide and silicon nitride;

d) selectively depositing a hard cap layer on said metal layer in said first opening; said hard cap layer composed of a material selected from the group consisting of tungsten, tungsten nitride (WN) and tungsten silicide;

e) chemical-mechanical polishing said hard cap layer, said hard mask and said metal layer to completely remove said hard mask resulting in a metal line having a dishing free flat top surface; the chemical-mechanical polish rate of said hard cap is less than the rate of said metal layer; the chemical-mechanical polish rate ratio between said hard cap layer to said metal layer is between 1:10 and 1:50.

11. The method of claim 10 wherein said first dielectric layer composed of a material selected from the group consisting of silicon oxide and silicon nitride, and has a thickness in a range of between about 0.2 and 1.0 μm.

12. The method of claim 10 wherein said hard mask has a thickness in a range of between about 500 and 1500 Å.

* * * * *